United States Patent
Leyonhjelm et al.

(10) Patent No.: US 6,351,677 B1
(45) Date of Patent: Feb. 26, 2002

(54) METHOD AND DEVICE IN A TELECOMMUNICATION SYSTEM

(75) Inventors: Scott Allen Leyonhjelm, Sundbyberg; Mark Briffa, Tyresö, both of (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 09/184,973

(22) Filed: Nov. 3, 1998

(30) Foreign Application Priority Data

Nov. 3, 1997 (SE) .............................. 9704011

(51) Int. Cl.[7] .............................................. G06F 19/00
(52) U.S. Cl. .......................................... 700/44; 700/194
(58) Field of Search .............................. 700/44, 45, 55, 700/71, 72, 193, 194, 251; 330/145, 284; 455/102, 116

(56) References Cited

U.S. PATENT DOCUMENTS

| | | | | |
|---|---|---|---|---|
| 4,885,551 A | * | 12/1989 | Myer | 330/52 |
| 4,943,783 A | * | 7/1990 | Nojima | 330/149 |
| 5,134,718 A | | 7/1992 | Gailus | 330/15 |
| 5,157,346 A | | 10/1992 | Powell et al. | 330/149 |
| 5,420,536 A | | 5/1995 | Faulkner et al. | 455/102 |
| 5,650,758 A | * | 7/1997 | Xu et al. | 330/149 |
| 5,719,527 A | * | 2/1998 | Bateman | 330/10 |
| 5,862,460 A | * | 1/1999 | Rich | 330/149 |

FOREIGN PATENT DOCUMENTS

| | | |
|---|---|---|
| EP | 0 648 012 | 4/1995 |
| EP | 0 706 259 | 4/1996 |
| EP | 0 731 556 | 9/1996 |
| WO | 94/05078 | 3/1994 |

* cited by examiner

*Primary Examiner*—William Grant
*Assistant Examiner*—Kidest Bahta
(74) *Attorney, Agent, or Firm*—Burns, Doane, Swecker & Mathis, L.L.P.

(57) ABSTRACT

According to the invention, a Cartesian control means (16) comprising a phase rotator (50) and a phase adjuster (52) is provided. With a method and a device according to the invention, a system is provided that is unconditionally stable with respect to non-phase alignment, regardless of input power changes, temperature and component ageing. No certain conditions need to be placed upon the control system to ensure stability, i.e. the system is non-obtrusive and requires no off-line calibration. The inclusion of the phase rotator (50) and phase adjustment techniques into the Cartesian control system makes this possible.

31 Claims, 8 Drawing Sheets

METHOD AND DEVICE IN A TELECOMMUNICATION SYSTEM

BACKGROUND

The present invention relates to Cartesian control systems.

In a telecommunication system, particularly in RF applications, efficient methods of linearisation are called for in order to minimize intermodulation, one cause of which being the distortion generated by non-linearities in power amplifiers.

In wide band systems, there are two main methods for dealing with distortion of amplifiers; predistortion and feedforward. Predistortion means that the distortion introduced by the main amplifier is inversely modelled and applied at the input of the amplifier, thereby making the total, ideally, equal to a power independent constant.

The feedforward technique consists basically of two independent steps. The first step is to extract the distortion introduced by the main amplifier on the signals to be amplified. This is referred to as extracting an error signal. The second step is to inject this error signal in anti-phase and time-aligned at the output of the feedforward amplifier to thereby cancel out the distortion. The performance of the feedforward technique is dependent upon the ability to add rotated signal vectors correctly in anti-phase and equal amplitude.

U.S. Pat. No. 5,157,346 to Powell et. al. discloses a feedforward lineariser with a Cartesian control system. Cartesian control in this case refers to the combination of complex Cartesian correlation detection followed by linear Cartesian feedback control.

U.S. Pat. No. 5,134,718 to Gailus discloses a method and device for correcting an initial phase relationship in a linear transmitter between an input signal and an input feedback signal, opening the feedback loop (open loop) and then calculating the phase from special injected training signals. The method of opening the feedback loop inherently has the disadvantageous consequence of interrupting the normal operation of the feedback loop, thereby causing disturbances in the system. Such a method is to be considered as an obtrusive method because it interrupts the normal operation of the feedback loop.

WO94/05078 to Bergsten and Nyström discloses a method of correcting the phase relationship within a Cartesian feedback loop at intermediate frequency.

SUMMARY

In a Cartesian control system, the phase between the feedback and the input signals change with temperature, component ageing and input power etc. If Cartesian feedback and input signals are not phase-aligned then stability can be compromised. It is thus desirable to track and adjust these phase changes to ensure stability.

Dependencies on temperature, component ageing and input power etc. can alternatively be characterized and system parameters modified to allow for better start-up operation. This can be considered as an obtrusive phase adjuster technique, which requires off-line calibration. Such interruptions to normal operation are inconvenient if not unacceptable to the operation of most systems e.g. feedforward linearisers. Additionally, such modifications will lower the potential bandwidth, or speed, of the control system. Further, these modifications do not change the fact that the system is conditionally stable, therefore instability can still occur during operation.

Accordingly, it is an object of the present invention to provide a non-obtrusive control means for a Cartesian control system, said control means providing unconditional stability with respect to misalignment in phase between the feedback and input signals.

A further object of the invention is to provide a non-obtrusive method and device for a Cartesian control system that is unconditionally stable without reducing bandwidth or accuracy in the system.

A further object of the invention is to provide a method and a device for keeping feedback signals and input signals phase-aligned within a Cartesian control system in general.

Another object of the present invention is to provide a method and a device for a feedforward lineariser for RF-applications that is unconditionally stable.

Another object of the invention is to provide a method and a device for a phase adjuster technique for use in a feedforward lineariser, which is non-obtrusive to normal operation, i.e. requiring no off-line calibration.

Another object of the present invention is to provide a method and a device for a Cartesian feedback transmitter that is unconditionally stable.

Another object of the invention is to provide a method and a device for a phase adjuster technique for use in a Cartesian feedback transmitter, which is non-obtrusive to normal operation, i.e. requiring no off-line calibration.

These objects are achieved by a method and a device having the characterizing features of the independent claims. Further features and improvements of the invention, are given in the dependent claims.

According to the invention, a Cartesian control system is provided having a linear Cartesian loop feedback control system comprising a phase rotator and a phase adjuster. With a method and a device according to the invention, a system is provided that is unconditionally stable with respect to non-phase alignment, regardless of input power changes, temperature, manufacturing spread, component ageing etc. No certain conditions need to be placed upon the control system to ensure stability, and the system is non-obtrusive and requires no off-line calibration. The inclusion of the phase rotator and phase adjustment techniques into the Cartesian control system makes this possible.

Because the feedback and input Cartesian signals are kept phase-aligned, the stability margin requirements can be reduced. If this is applied to a known system, a wider bandwidth, i.e. a faster control technique can be achieved with the given stability margin. Thus a system is provided that is unconditionally stable without reducing the bandwidth or accuracy of said system.

BRIEF DESCRIPTION OF THE DRAWINGS

For a more complete understanding of the present invention and for further objects and advantages thereof, reference is now made to the following description taken in conjunction with the accompanying drawings, in which.

DETAILED DESCRIPTION

Figure 2A:
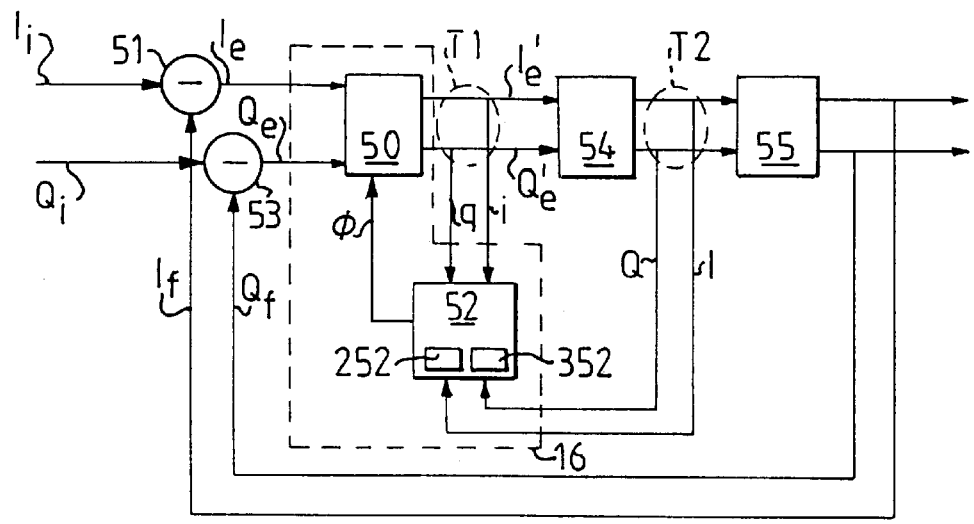
FIG. 2A shows an embodiment of a Cartesian control system including a supervisory control loop having a control means.

FIG. 2A is a block diagram showing an embodiment of a Cartesian control system. The Cartesian control system receives input signals $I_i$, $Q_i$ to subtractors 51,53 which also receive feedback signals If, $Q_f$. The subtractors generate error signals, which are delivered to a controlled phase rotator 50. The outputs $I'_e$, $Q'_e$ are delivered to a filter unit 54, the outputs of which are delivered to a system to be controlled 55. The output of the system to be controlled 55 is tapped, used for feedback signals $I_f$, $Q_f$ and delivered to the subtractors 51, 53, as described above. The above described components form a control loop in a Cartesian control system.

Figure 6A:
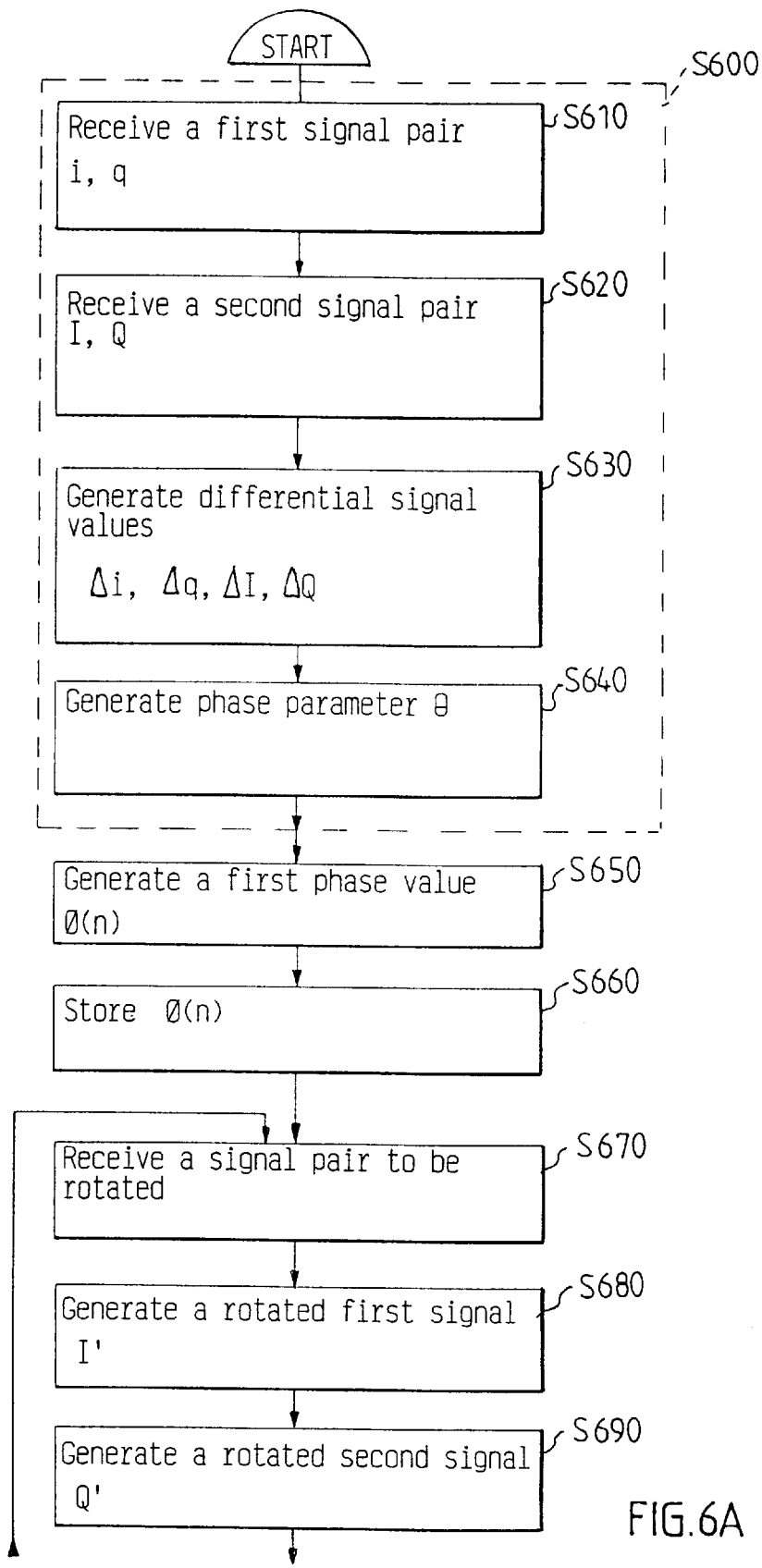
FIGS. 6A and 6B is a flow chart illustrating an embodiment of a method according to the invention.
Figure 6B:
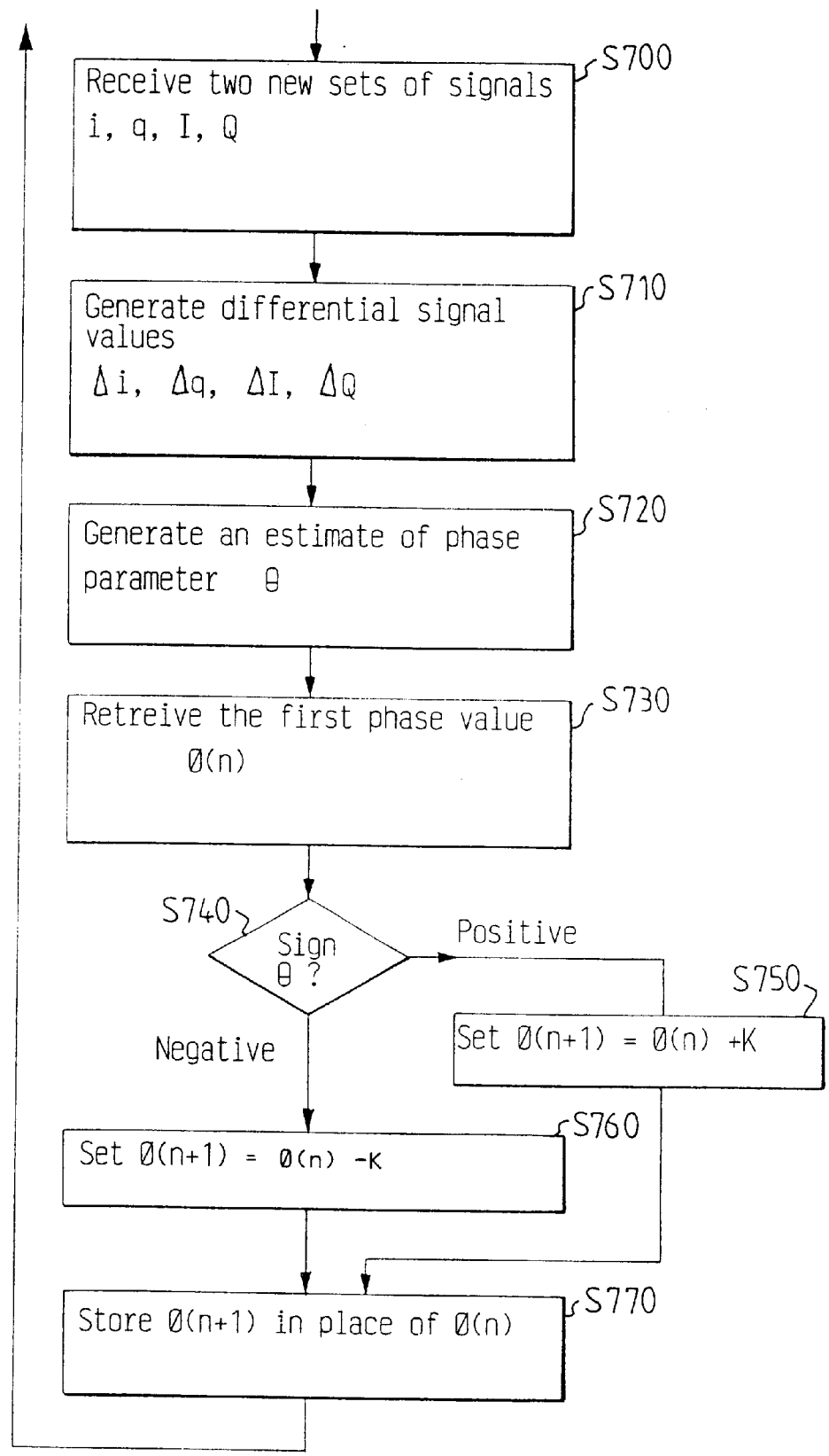

According to an embodiment of the invention the Cartesian control system includes a controller 16. The controller 16 is coupled to the control loop of the Cartesian control system so as to enable reception of first signals i,q originating from a first location T1 of the Cartesian control system, as well as reception of second signals I,Q originating from a second location T2 of the Cartesian control system.
FIG. 6

FIG. 6 is a flow chart for illustrating an embodiment of a method of compensating a phase rotation in a control loop.

In a first step S600, a phase rotation between signals at the first location T1 and the second location T2 is measured or estimated. This is achieved by receiving a first signal pair i,q from location T1 (step S610), and by receiving a second signal pair I,Q from location T2. Thereafter, a set of differential signal values $\Delta i, \Delta q, \Delta I, \Delta Q$ are generated (step S630).

A phase parameter θ is generated in dependence of the differential signal values (step S640). The phase parameter θ is indicative of a phase rotation in the control loop between the first location T1 and the second location T2. According to one embodiment of step S640 the phase parameter θ is calculated as:

$$\theta = \tan^{-1} \theta_2$$

where $$\theta_2 = \frac{\Delta q \times \Delta I - \Delta i \times \Delta Q}{\Delta q \times \Delta Q + \Delta i \times \Delta I}$$

In a subsequent step, S650, a first phase value φ(n) is generated. The phase value φ(n) is calculated in dependence of the phase parameter θ. The first phase value, generated in step S650, is stored in a memory for use in subsequent steps of this method (step S660).

Thereafter, step S670, a signal pair to be rotated $I_e Q_e$ is received. In step S680, a rotated first signal I' is generated in dependence of the first phase value φ(n) and the signal $I_c$ to be rotated. A rotated second signal Q' is generated in a corresponding manner (step S690).

The rotation provided by step S670–S690 is made for the purpose of compensating the detected phase rotation θ.

In step S700, the controller 16 receives two new sets of signals i,q and I,Q. Thereafter, in step S710, the controller 16 generates differential signal values $\Delta i, \Delta q$ and $\Delta I, \Delta Q$. And in response to the differential signal values, a new estimate θ is generated. The new estimate θ can be obtained in a simplified manner, allowing for a quicker calculation method.

Whereas the phase parameter θ in the above step S630 is calculated using an inverse tangent calculation, the simplified estimate obtained according to step S720 requires only two multiplications and one subtraction:

$$\theta = \Delta q \times \Delta I - \Delta i \times \Delta Q$$

Therefore, this simplified method step S720 can be performed at a quicker rate than the above described method step S640.

In a subsequent step, S730, the first phase value φ(n), which was stored in the above described step S660, is retrieved. Thereafter (step S740) a test is performed so as to determine whether the new estimated phase parameter θ has a positive sign or a negative sign. If the sign of the phase parameter generated in step S720 is positive, then a new phase value φ(n+1) is set to a value higher than the first phase value φ(n). According to step S750, the new phase value is obtained by adding a suitable number K of radians to the retrieved phase value φ(n). The value K to be added may be only a fraction of a radian.

If, on the other hand, the sign of θ is negative, then the new phase value φ(n+1) is set to a lower value than the previous phase value φ(n).

After the generation of the new phase value φ(n+1), this value is stored so as to replace the earlier phase value φ(n), step S770. Thereafter, the method is repeated, starting with the above described step S670 so as to rotate a pair of signals to be rotated by the new phase value φ.

Figure 1:
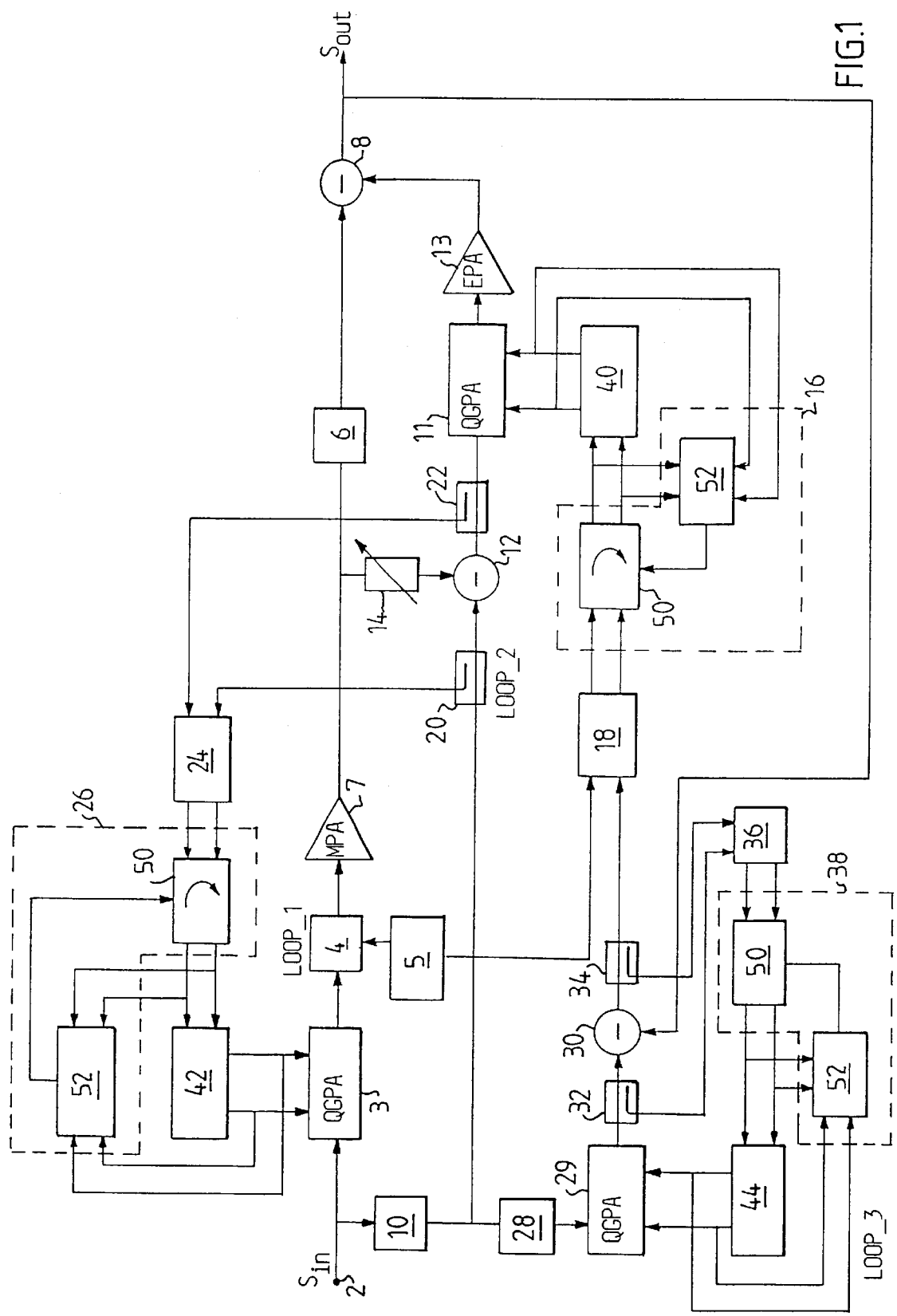
FIG. 1 shows a feedforward linear amplifier with a control system according an embodiment of to the invention.

The FIG. 1 illustrates a feedforward lineariser according to an embodiment of the invention.

The lineariser includes three control means 16,26,38 according to a first embodiment of the invention.

The control means according to the first embodiment of the invention controls the inputs of a Quadrature Gain and Phase Adjuster (QGPA). Note that a detector scheme that produces Cartesian error signals is required prior to the control means 16,26,38, e.g. a Complex Cartesian Correlator or a Pilot recovery and Quadrature down conversion circuit. There are three QGPA:s in the illustrated lineariser.

In the following description similar or identical features in different embodiments will be indicated by the same reference numerals. In some instances, however, there are different reference numerals for features that operate in a similar manner e.g. control means 16,26,38 indicating similar control means at different positions in the feed-forward lineariser according to FIG. 1.

Control means according to embodiments of the invention are here shown to control all three QGPA:s but other embodiments are readily understood by the man skilled in the art, the control means being used to control one or more of the QGPA:s of a feed-forward lineariser. The invention is hereby described as a digital system, but it is obvious to the man skilled in the art that the inventive concept may be applied to a system comprising analogue parts as well.

A multi carrier signal $s_{in}$ to be linearised is fed to a first QGPA 3 via an input 2 of the lineariser. From the first QGPA 3, where the signal can be gain and phase adjusted, the signal is forwarded to a pilot insertion means 4 by which a pilot signal, generated in a pilot generator 5, is inserted into the signal. The resulting signal is fed to an MPA 7 (main power amplifier). The signal is amplified in the MPA 7 and subsequently delayed in a first delay means 6, then fed to a first subtractor 8. The input signal $s_{in}$ is delayed in a second delay means 10 and combined in a second subtractor 12 with the output signal of the MPA 7 after this output signal has been attenuated in an attenuator means 14. The combined signal output from the second subtractor 12 is fed to a second QGPA 11.

The second QGPA 11 is controlled via a first gain and filter means 40, which is supplied with Cartesian control signals I, Q from a first control means 16 according to an embodiment of the invention. The first control means 16 is supplied with Cartesian error signals $I_e$, $Q_e$ from a pilot recovery and quadrature down conversion executed in a conversion means 18, said conversion means receiving the pilot tone from the pilot generator 5. An output signal from the second QGPA 11 is fed to an error power amplifier EPA 13 in which it is amplified and the resulting signal is fed to the first subtractor 8. The first subtractor 8 combines the two signals with which it has been supplied to produce a linearised output signal $s_{out}$. The second QGPA 11 together with the first control means 16 and its associated circuitry constitutes a loop, LOOP_2, of the feedforward lineariser. The loop LOOP_2 operates to reduce or cancel distortion.

The lineariser of FIG. 1 comprises two more loops, LOOP_1 for suppressing carriers from the MPA output signal, and LOOP_3 for suppressing carriers from the lineariser output signal $s_{out}$. In LOOP_1 (for suppressing carriers from the MPA output signal), the input signal $s_{in}$, delayed in the second delay means 10, is tapped before and after the second subtractor 12, using a first 20 and second 22 coupler respectively. These tapped signals are fed to a first complex Cartesian Correlator 24. The first complex Cartesian Correlator 24 produces Cartesian error signals which are supplied to a second control means 26 according to the invention. The second control means 26 generates Cartesian control signals for the control of the first QGPA 3. Said Cartesian control signals are fed to the first QGPA 3 via a second gain and filter means 42.

In LOOP_3 (for suppressing carriers from the lineariser output signal $s_{out}$), the delayed signal from the second delay means 10 is further delayed in a third delay means 28 and fed to a third QGPA 29. From the third QGPA 29, the signal is forwarded to a third subtractor 30 in which it is combined with a sample of the linearised output signal $s_{out}$. The thereby combined signal is fed to the conversion means 18 executing the pilot recovery and quadrature down conversion for generating error signals for the first control means 16 in the distortion cancellation loop, LOOP_2. The signal is tapped before and after the third subtractor 30 by a third 32 and fourth 34 coupler respectively, and the tapped signals are fed to a second Cartesian Correlator 36. In the second Cartesian Correlator 36, control signals for a third control means 38 are generated. The third control means 38 is used to control the third QGPA 29 in LOOP_3 (for suppressing carriers from the lineariser output signal), and generates Cartesian control signals which are fed to the third QGPA 29 via a third gain and filter means 44.

FIG. 2

Figure 2B:
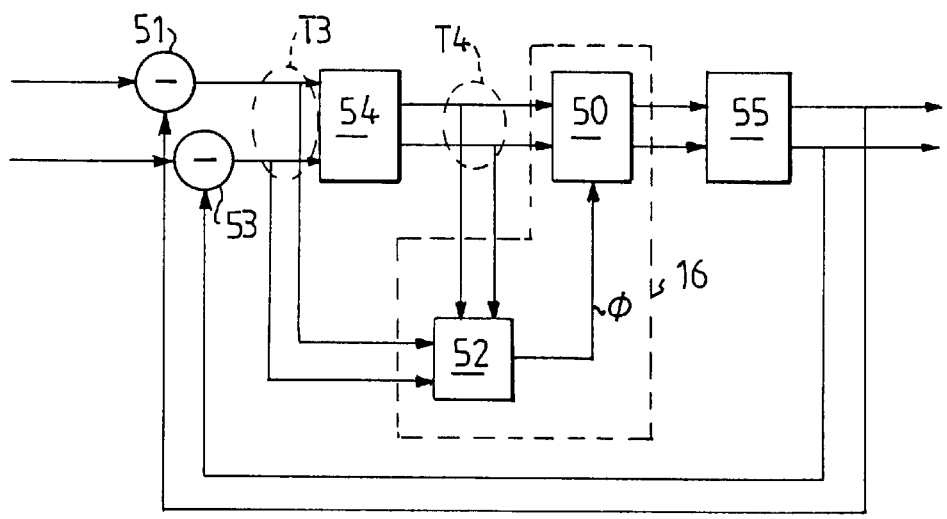
FIG. 2B shows another embodiment of a Cartesian control system including a supervisory control loop having a control means.
Figure 2C:
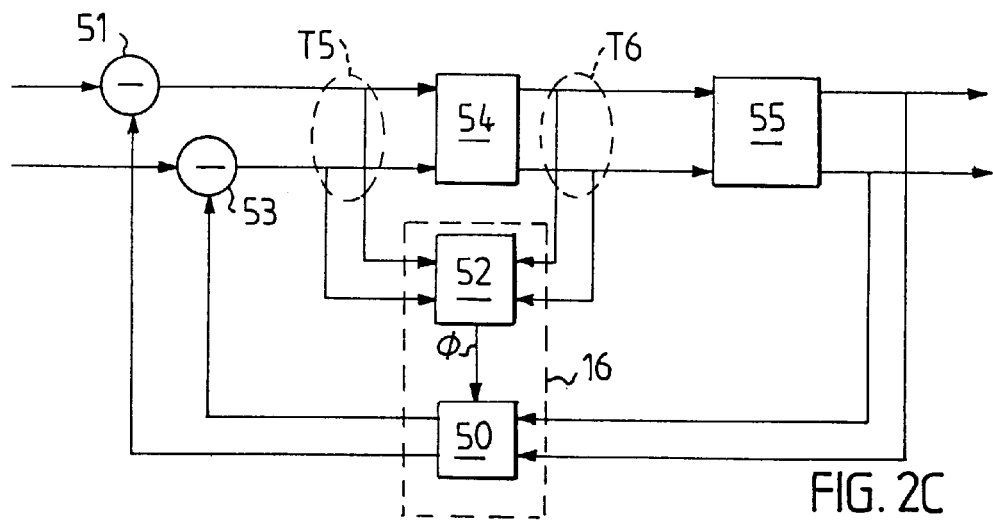
FIG. 2C shows yet another embodiment of a Cartesian control system including a supervisory control loop having a control means.

FIGS. 2A, 2B, and 2C show three embodiments of a Cartesian control system including a supervisory control loop and a control means 16 according to an embodiment of the invention. Cartesian input and feedback signals are combined to form Cartesian error signals and, according to embodiments of the invention, either the Cartesian error signals or the Cartesian feedback signals are rotated by a phase shift ϕ so that phase-alignment is maintained between input and feedback signals. This rotation is controlled by a phase adjuster 52. Two sets of signals are tapped from the Cartesian control system and fed to the phase adjuster. Depending on where these two sets of signals are tapped, the phase parameter derived will be either a bulk phase shift between the tap points through the system to be controlled (FIG. 3), or a differential phase shift between the tap points through the system to be controlled and the phase rotator (FIG. 2).

In FIG. 2A, the control means 16 comprises a phase rotator 50 and a phase adjuster 52 comprising a phase parameter deriving means 252 and a phase adjusting means 352. Cartesian error signals $I_e$ and $Q_e$ are inserted into the phase rotator 50 wherein they are phase rotated. Here supplied by the subtraction 51, 53 of input signals $I_i$, $Q_i$ and feedback signals $I_f$, $Q_f$. Cartesian error signals could also be supplied in some other way, (by for instance an equivalent of the conversion means 18 in FIG. 1), well known in the art. In FIG. 2A, the phase rotator 50 is controlled by an output signal ϕ of the phase adjuster 52. The phase rotated signals $I_e'$ and $Q_e'$ are fed to a gain and filter means 54. The output signals from the gain and filter means 54 are fed to the phase adjuster 52 and to a system to be controlled 55. The output signals from the system to be controlled 55 constitute the Cartesian feedback signals $I_f$, $Q_f$. The system to be controlled 55, is here shown to have two outputs, but feedback signals could for instance be supplied on separate outputs.

FIGS. 2B and 2C show alternative ways of applying the control means 16 to the loop according to a second and a third embodiment of the invention, their function being in correspondence with that of FIG. 2A. In all the embodiments shown in FIG. 2, signals are tapped by sets of tapping means T1–T6 from around the system to be controlled such that the phase parameter deriving means 252 estimates the differential phase shift. In FIG. 2, the tapping means T1–T6 comprise tap points, but they could also comprise couplers 20,22,32,34 as in the embodiment shown in FIG. 1, the feedforward lineariser.

The phase rotator 50 is controlled by the phase adjuster 52, and implements the phase rotation of the Cartesian signals. According to the invention, the adaptive phase adjuster 52 corrects the phase shift ϕ used in the phase rotator 50, such that the Cartesian input and feedback signals remain phase-aligned.

The Operation of the Phase Adjuster 52

The phase adjuster 52 operates as follows: The phase parameter deriving means 252 calculates a phase parameter θ, using one of the algorithms illustrated below. The phase parameter θ is then used by the phase- adjusting means 352 to update the phase value ϕ. The phase value ϕ is delivered from the phase adjuster 52 to the phase rotator 50. The phase rotator 50 rotates the error signals $I_e$ $Q_e$ in accordance with the received phase value ϕ. This may be an iterative procedure. In the embodiments shown in FIG. 2 the update is achieved by one of the following formulas:

$$\phi_{(n+1)}=\phi_{(n)}+\theta \tag{1}$$

or $$\phi_{(n+1)}=\phi_{(n)}-\theta \tag{2}$$

Whether the phase parameter θ should be added to the previous phase value $\phi_{(n)}$, or subtracted from the previous phase value $\phi_{(n)}$, is determined by the choice of tap points.

Hence an updated phase value $\phi_{(n+1)}$ is obtained in dependence on a previous phase value $\phi_n$ and the phase parameter θ.

The phase adjustment technique is, according to this embodiment, comprised in the phase adjuster 52. Said technique uses four input signals tapped from the Cartesian control loop (see FIG. 2), i.e. it is not obtrusive. No off-line calibration is therefore needed in a system according to the invention. Two signals that are tapped from before the gain and filter means 54 are referred to as the first tap signals, i and q (FIG. 2 shows possible locations from which these signals for instance can be tapped), and two signals tapped after the gain and filter means 54 are referred to as the second tap signals, I and Q. According to an embodiment of the invention, phase-alignment is maintained between Cartesian input signals and Cartesian feedback signals, using a phase rotation of either of said error or feedback signals based on a phase shift calculated between the two sets of signals tapped at two different locations in the Cartesian control loop.

The phase parameter deriving means 252 receives the four tapped signals i, q, I, Q, and generates four gradient signals, $\Delta i$, $\Delta q$, $\Delta I$ and $\Delta Q$. These gradients are used to estimate a phase parameter $\theta$. To further improve the phase parameter $\theta$, the result can be inte-grated or averaged. The phase parameter $\theta$ is then, in this case (FIG. 2), added to, or subtracted from, the current phase $\phi$ to generate the new phase value $\phi_{(n+1)}$ which subsequently is used to control the phase rotator 50. The system according to the invention derives the phase parameter $\theta$ non-obtrusively, regardless of the system state i.e. settled, converging, undergoing a transient or unstable.

Gradients of each of these signals i, q, I, Q, are first calculated. The generation of signal gradients in an analogue system, is well known to the man skilled in the art and could be done for instance by a differentiator. In a digital system, this could for instance be done by subtracting the stored last value:

$$\Delta i = i(n) - i(n-1).$$

If the tapped signals have an origin near to zero, the gradient can be approximated by using the current value: $\Delta i = i(n)$.

These gradient signals are then used to estimate the phase parameter $\theta$ in the Cartesian control system. According to embodiments of the invention, the phase parameter $\theta$ is generated in dependence from the four gradient signals.

According to one embodiment the phase parameter $\theta$ is calculated as (technique 1):

$$\theta = \tan^{-1}\theta_2 \quad (3)$$

where $$\theta_2 = \frac{\Delta q \times \Delta I - \Delta i \times \Delta Q}{\Delta q \times \Delta Q + \Delta i \times \Delta I} \quad (4)$$

According to another embodiment, referred as a second technique, the phase parameter $\theta$ is calculated as follows (technique 2):

$$\theta = \frac{\Delta q \times \Delta I - \Delta i \times \Delta Q}{\Delta q \times \Delta Q + \Delta i \times \Delta I} \quad (5)$$

Equation (5) provides an approximation of equation (3).

$$\theta = \sin^{-1}\theta_4 \quad (6)$$

where $$\theta_4 = \frac{\Delta q \times \Delta I - \Delta i \times \Delta Q}{\sqrt{(\Delta q^2 + \Delta i^2)(\Delta Q^2 + \Delta I^2)}} \quad (7)$$

According to yet another embodiment the phase parameter $\theta$ is calculated as follows (technique 3):

According to another embodiment (technique 4) the phase parameter $\theta$ is calculated as an approximation of technique 3:

$$\theta = \frac{\Delta q \times \Delta I - \Delta i \times \Delta Q}{\sqrt{(\Delta q^2 + \Delta i^2)(\Delta Q^2 + \Delta I^2)}} \quad (8)$$

According to yet another embodiment the phase parameter $\theta$ is calculated as follows (technique 5):

$$\theta = \Delta q \times \Delta I - \Delta i \times \Delta Q \quad (9)$$

Equation (9) is a simplification of all above techniques, using numerator only.

In all of the above equations (3) to (9) the phase parameter $\theta$ is expressed as radians. Techniques 1 and 3 are linear phase detector functions and can be used to generate a phase parameter. Techniques 2 and 4 are approximations of techniques 1 and 3 respectively. They generate an approximation of the absolute phase parameter, and can also be used with some restrictions as to the denominator being zero. Technique 5 is basically a non-linear phase detector function.

The phase parameter $\theta$ as calculated from one of the equations, may also require correction before being used by the phase adjusting means 352. For example, intervention may be required on the detection of certain boundary conditions, such as saturation of the tap signals etc.

A correct interpretation of what quadrant the phase parameter $\theta$ falls into must also be taken into account when using the equations. For example in technique 1 and 2, all four quadrants can be correctly resolved provided the numerator and denominator are examined. In technique 3, 4 and 5 only two quadrants can be correctly resolved since the denominator is always positive.

$\tan(-1/1) \rightarrow \theta = +135°$ in second quadrant $\tan(1/-1) \rightarrow \theta = -45°$ in fourth quadrant.

The phase adjustment means then uses the phase parameter $\theta$ to update the phase $\phi$. For example in a situation where the tap points generate a differential phase estimate (FIGS. 1, 2 & 5), then a scaled quantity of the phase parameter $\theta$ can be added to the current phase:

$$\phi(n+1) = \phi(n) + k\theta;$$

where k is a scaling factor. It may be necessary to scale the phase parameter $\theta$ to ensure stability around the phase aligning loop. Another possibility is to take the sign of the phase estimate which determines the direction in which to change the phase $\phi$, and then use k as a scaling factor that gives the size of this change.

$$\phi(n+1) = \phi(n) + k\,\text{sgn}(\theta);$$

where $\text{sgn}(\theta) = 1$ for $\theta >= 0$ $\text{sgn}(\theta) = -1$ for $\theta < 0$ The estimate of the phase parameter $\theta$ can also be improved by integration (averaging), before being used by the phase adjusting means 352, as according to this embodiment of the invention.

The phase adjuster techniques according to the invention continue to operate regardless of whether the feedback loop has settled, is converging, is undergoing a transient situation or is presently unstable (a temporary state as eventually the phase is corrected and the system returns to stability).

The Phase Rotator 50

The phase rotator 50 according to an embodiment of the invention comprises a device for performing a complex multiplication and referring to FIG. 2A performs the operation expressed by the following equations:

$$I_e' = I_e \cos\phi - Q_e \sin\phi$$

$$Q_e' = I_e \sin\phi + Q_e \cos\phi$$

The phase rotator 50 could alternatively comprise an approximation of said equations.

The gain and filter means 54 comprise a gain and a low pass filtering function. Other ways of filtering well known in the art could also be used. Together with the analogue circuitry, they govern the time constant (speed or bandwidth) of the control system.

FIG. 3

Figure 3A:
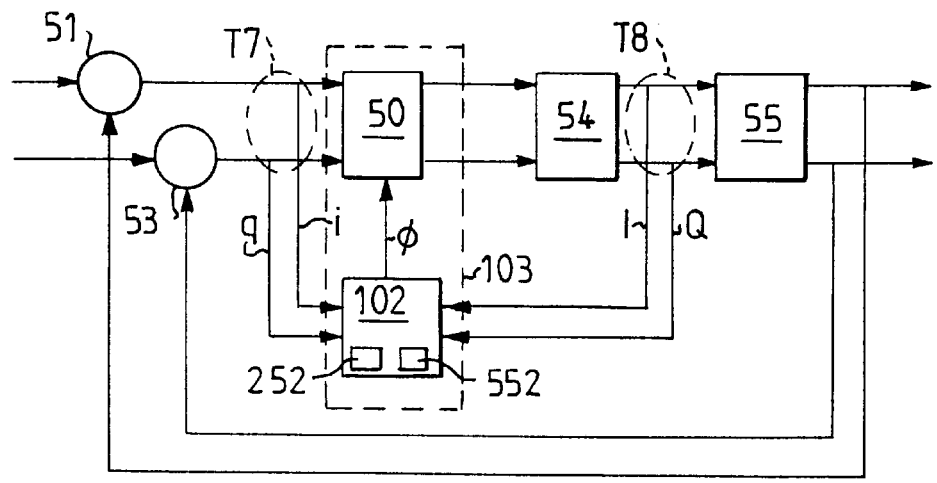
FIGS. 3A, 3B, and 3C show another three embodiments of a Cartesian control system including a supervisory control loop having a control means.
Figure 3B:
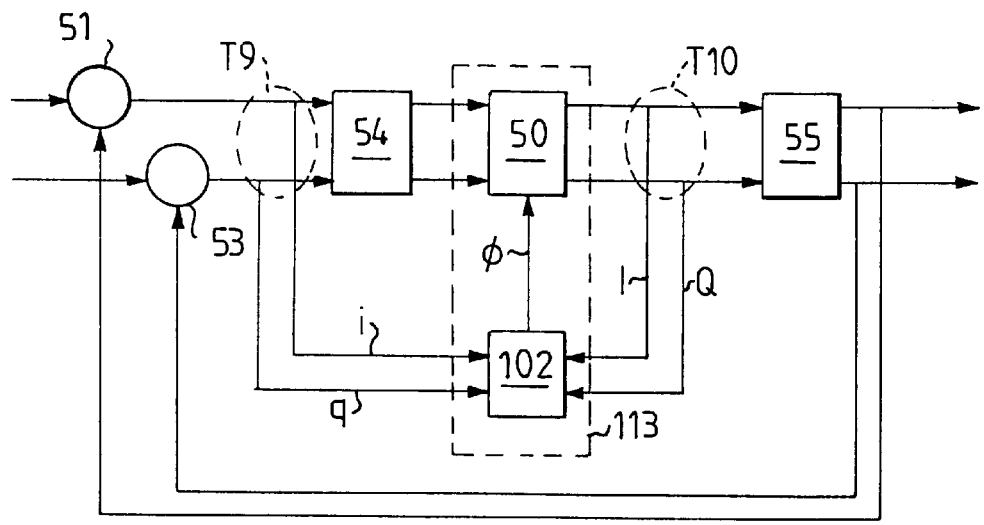
Figure 3C:
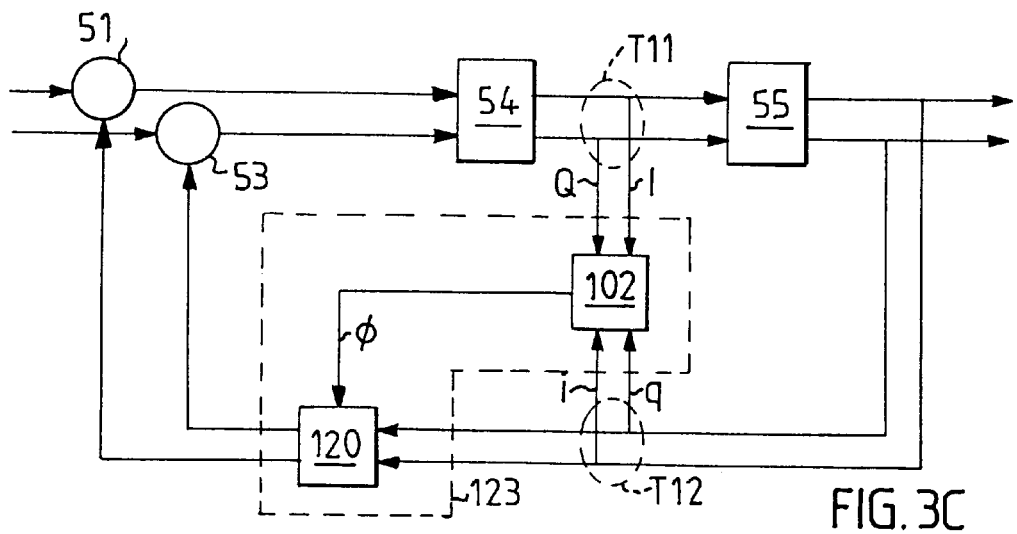

FIG. 3 shows three more ways of applying a control means according to the invention to a feedback loop. FIGS. 3A, 3B and 3C show a control means 103, 113, 123 according to a fourth, fifth and sixth embodiment of the invention respectively.

In these embodiments of the invention the phase rotator 50 is controlled by a phase adjuster 102 and implements the phase rotation of the Cartesian signals. According to an embodiment of the invention, the adaptive phase adjuster 102 corrects the phase shift $\phi$ used in the phase rotator 50 such that the Cartesian input and feedback signals remain phase-aligned.

The phase adjuster 102 corresponds to the phase adjuster 52, but it differs in that phase value adjusting means 552 operates slightly differently from the above described phase adjusting means 352.

The phase parameter deriving means 252 calculates a phase parameter $\theta$, through either one of the algorithms described above, or an approximation thereof. In the context of the embodiments shown in FIG. 3, the following conditions apply to phase parameter deriving means 252. When technique 1 (eq. 3) is used, no restrictions apply. Technique 2 (eq. 5) works well when $\theta$ is in the range from $-45°$ to $+45°$. Technique 2 (eq. 5) also works well when $\theta$ is in the range from $135°$ to $225°$. Technique 3 (eq. 6) works in quadrants 1 and 4, i.e. $-90° < \theta < 90°$. Technique 4 (eq. 8) works well when $\theta$ is in the range from $-45°$ to $+45°$. Technique 5 (eq. 9) also works well when $\theta$ is in the range from $-45°$ to $+45°$.

The angular values are presented in degrees in this text for the purpose of simplifying the understanding. The calculations, however should be made with radians. The parameter value obtained by equation (5) is expressed in radians. Likewise the parameter value obtained by equations (8) and (9) is expressed in radians.

In the embodiments shown in FIG. 3 the update of the phase value $\phi$ is achieved by one of the following formulas:

$$\phi_{(n+1)} = +\theta$$

or $$\phi_{(n+1)} = -\theta$$

Whether the phase value $\phi_{(n+1)}$ should be set to $+\theta$ or to $-\theta$ is determined by the choice of tap points.

The phase adjustment technique is, according to this embodiment of the invention, comprised in the phase adjuster 102. Said technique uses four input signals tapped from the Cartesian control signal paths, i.e. it is not obtrusive. No off-line calibration is therefore needed in a system according to the invention. Two signals, i and q are tapped (FIG. 3 shows possible locations, T7, T9, T12 from which these signals for instance can be tapped), and another two signals are tapped, I and Q from locations T8, T10, T11. According to the invention, phase-alignment is maintained between Cartesian input signals and Cartesian feedback signals, using a phase rotation of either of said error or feedback signals based on a phase shift calculated between the two sets of signals tapped at two different locations.

The four tapped signals are used to generate four gradient signals, $\Delta i$, $\Delta q$, $\Delta I$ and $\Delta Q$. These gradients are used to estimate a phase parameter $\theta$. To further improve the phase parameter $\theta$, the result can be integrated or averaged. The new phase value $\phi_{(n+1)}$ is set equal to the value of the estimated phase parameter $\theta$, according to the embodiments described in connection with FIG. 3. The new phase value $\phi_{(n+1)}$ is subsequently used for controlling the phase rotator 50. The system according to the invention derives the phase parameter $\theta$ non-obtrusively, regardless of the system state, i.e. regardless of whether the system is settled, converging, undergoing a transient or unstable.

The estimated phase parameter $\theta$, which is generated by the phase parameter deriving means 252, may also require correction before being used by the phase adjusting means 552. For example, intervention also be required on the detection of certain boundary conditions, such as saturation of the tap signals etc.

A correct interpretation of what quadrant the phase parameter $\theta$ falls into must also be taken into account when using the equations, as previously discussed.

The estimate of the phase parameter $\theta$ can be improved by integration (averaging), before being used by the phase adjusting means 552, as according to this embodiment of the invention.

According to the embodiments shown in FIGS. 2 and 3, a supervisory control loop operates to monitor the phase shift in at least one of the components in the main control loop of the feedback control system. The supervisory control loop includes a phase parameter generator 252, a phase value generator 352,552, a phase rotator 50, and at least one component in the main control loop of the Cartesian control system.

FIG. 4

Figure 4:
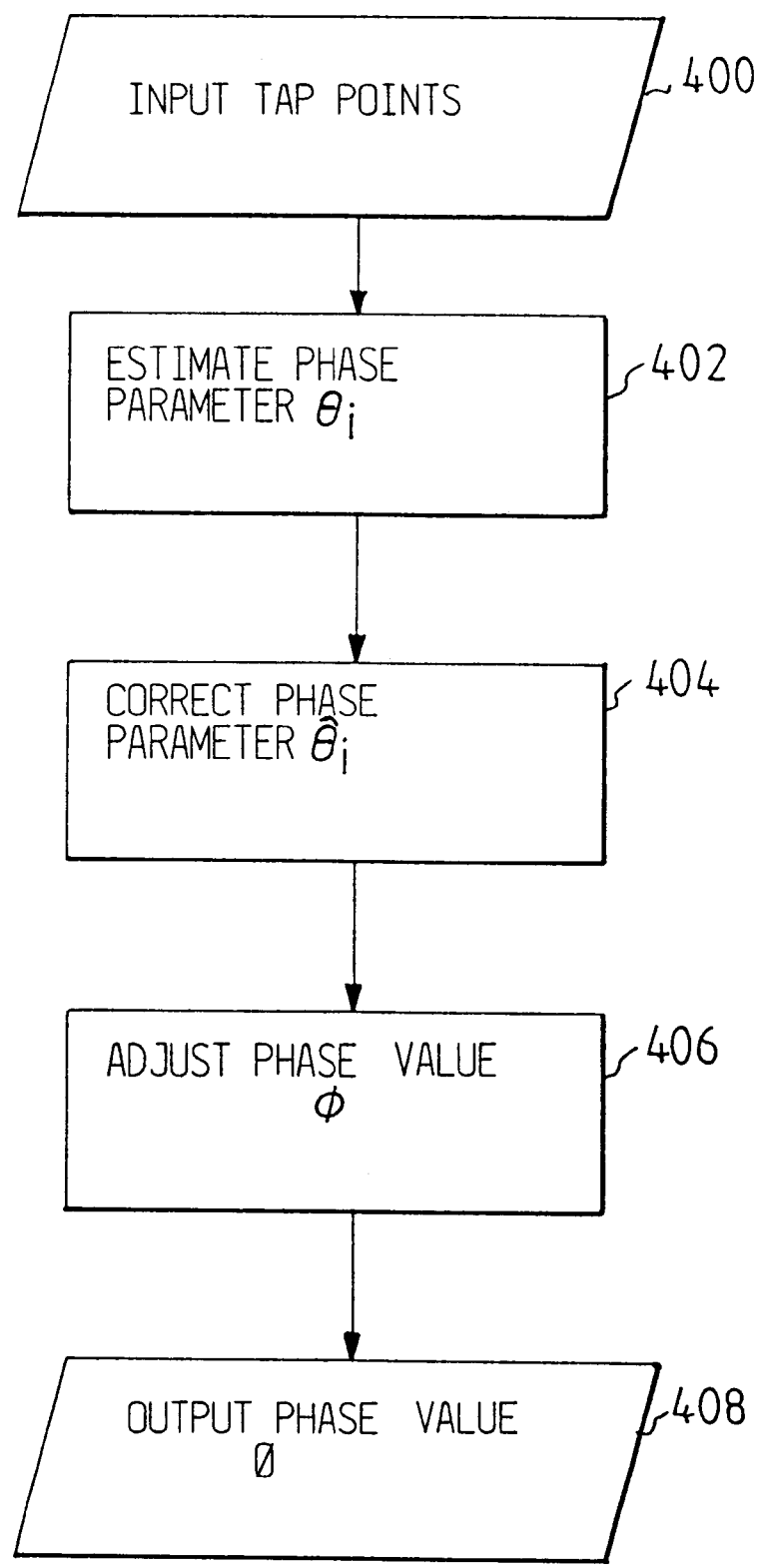
FIG. 4 shows a flow chart of a phase adjustment method according to an embodiment of the invention.

FIG. 4 shows a flow chart of a method of phase adjustment comprised in the phase adjuster 52,102 according to an embodiment the invention. Signals tapped at the first and second tap points are input, in step 400, to the phase adjuster 52 or 102.

The phase deriving means 252 comprised in the phase adjuster 52 or 102 estimates a phase parameter $\theta$ in step 402, using one of the equations given above, or an approximation of one of the equations given above.

If necessary, the phase parameter $\theta$ is corrected in step 404, and the corrected phase parameter $\theta$ is then used by the phase adjusting means 352,552, also comprised in the phase adjuster 52 or 102, to adjust, in step 406, the phase value $\phi$ which is output, in step 408, from the phase adjuster 52 and fed to the phase rotator 50 where it is used to rotate the Cartesian signals.

The phase rotator 50 operates to receive a Cartesian signal pair and to receive the phase value from the phase adjuster 52. The phase rotator 50 operates to rotate the Cartesian signals by an angle corresponding to the phase value $\phi$.

The corrected estimate of the phase parameter θ can be improved by integration (averaging) in an additional step, not shown in FIG. 4, before being used by the phase adjusting means 352 or 552.

A Digital System including a Digital Signal Processor

Figure 7:
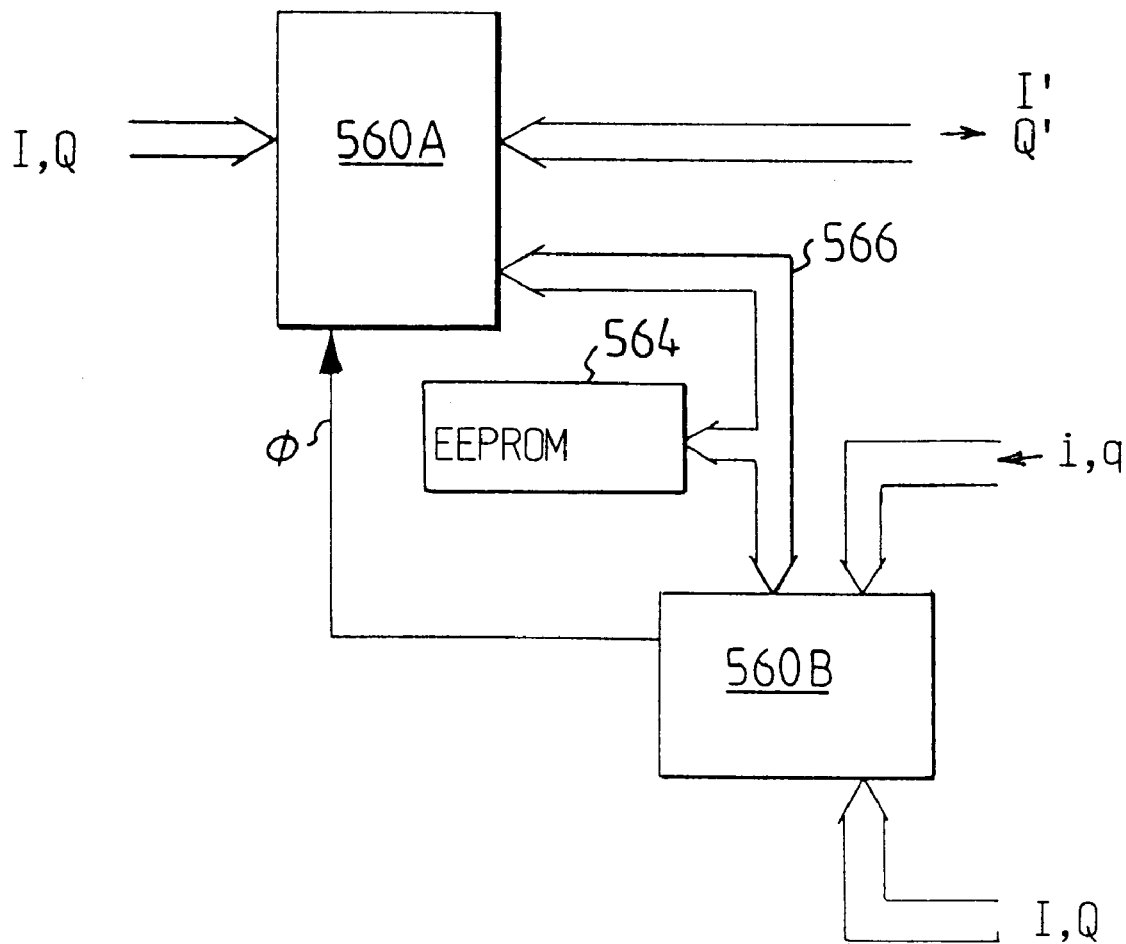
FIG. 7 is a block diagram of an embodiment of a controller.

As mentioned above, the method according to the invention may be implemented in a digital system. According to one embodiment of the invention the controller 16 comprises a digital signal processing device 560, a non-volatile memory 564 and a volatile memory (FIG. 7). The non-volatile memory 564 stores a computer program including computer readable code for controlling the digital signal processor to operate in accordance with a method described with reference to FIG. 4 in conjunction with FIGS. 2 or 3 above. The non-volatile memory 564 is coupled to the digital signal processor 560 via a data bus 566. The digital signal processing device 560 may include one, two or several digital signal processors 560A, 560B for performing the functions described below. The computer program may be provided on a different carrier, such as a compact disc, and it can be installed on the non-volatile memory 564 via a data bus. The controller shown in FIG. 7 is suitable to be connected in a Cartesian control system as described in FIG. 2 above. Although the digital signal processing device 560 and its function is described with reference to FIGS. 2 and 7 it is to be understood that it may be used with other embodiments of Cartesian control systems as well.

The phase adjuster 52, or 102 receives the first signal pair i, q and the second signal pair I, Q. The program routine recorded in the non-volatile memory causes the digital signal processor 560B to generate a differential value Δq, e.g. by temporarily storing consecutive values q(n−1), q(n) of the q-signal and then subtracting a previous value q(n−1) from the subsequent value q(n);

$$\Delta q = q(n) - q(n-1)$$

Differential values Δi, Δq, ΔI, ΔQ for each of the four signals i, q, I, Q are generated in the same manner.

A phase parameter θ is generated in dependence of the differential values Δi, Δq, ΔI, ΔQ. In this step the digital signal processor 560B executes calculations in accordance with the equations (3)–(9), described above.

Thereafter the program routine causes the digital signal processor to generate a phase value φ in dependence on the phase parameter θ. The phase value φ functions as a reference value in the process of phase rotation.

The Cartesian signal pair I, Q to be rotated is received by the controller 16, 103 113, 123. In the embodiment illustrated in FIG. 7, the signal pair I, Q to be rotated is received by processor 560A. The program routine causes the digital signal processor 560A to generate a pair of rotated Cartesian signals I', Q'in response to the phase value φ and the received signal pair I, Q. The rotation procedure may include performing a multiplication given by the following equations (referring to FIG. 2A):

$$I_e' = I_e \cos\phi - Q_e \sin\phi$$

$$Q_e' = I_e \sin\phi + Q_e \cos\phi$$

The program routine causes the digital signal processor to perform the above steps iteratively.

In the above described embodiment the digital signal processor 560N generates a phase parameter, the numerical value of which is actually used for controlling the phase value φ. According to another embodiment of the invention the program routine causes the digital signal processor to analyze the sign, positive or negative, of the phase parameter θ obtained using an approximation of equation (3) in combination with eq. (4). Alternatively an approximation of equation (6) in combination with eq. (7) is used. Examples of such approximations are given by equations (5) and (8), respectively, as well as by equation (9). The calculations are simplified by using approximations. According to a preferred version of this embodiment equation (9) is used. The simplified calculations render an advantageously quick and efficient digital processing of the data. Moreover, since the simplified calculations render an increased data processing rate it also renders a very efficient control.

The sign, positive or negative, of the phase parameter θ indicates whether the phase value φ needs to be increased or decreased. The program routine causes the digital signal processor to change the numerical value of the phase value φ in response to the sign of the phase parameter θ. Thereafter the program routine causes the digital signal processor 560A to generate a pair of rotated Cartesian signals I', Q' in response to the phase value φ and the received signal pair I, Q, as described above. These steps are iterated or repeated so as to maintain the phase parameter value at zero, or at a value near zero.

A scaling factor k may be used for determining how much to change the phase value in one iteration of the above described method.

$$\phi(n+1) = \phi(n) + k \operatorname{sgn}(\theta);$$

$\operatorname{sgn}(\theta) = 1$ for $\theta >= 0$
$\operatorname{sgn}(\theta) = -1$ for $\theta < 0$ The embodiment of the controller as shown in FIG. 7 may also be used for performing the embodiment of the method described above with reference to FIG. 6.

FIG. 5

Figure 5:
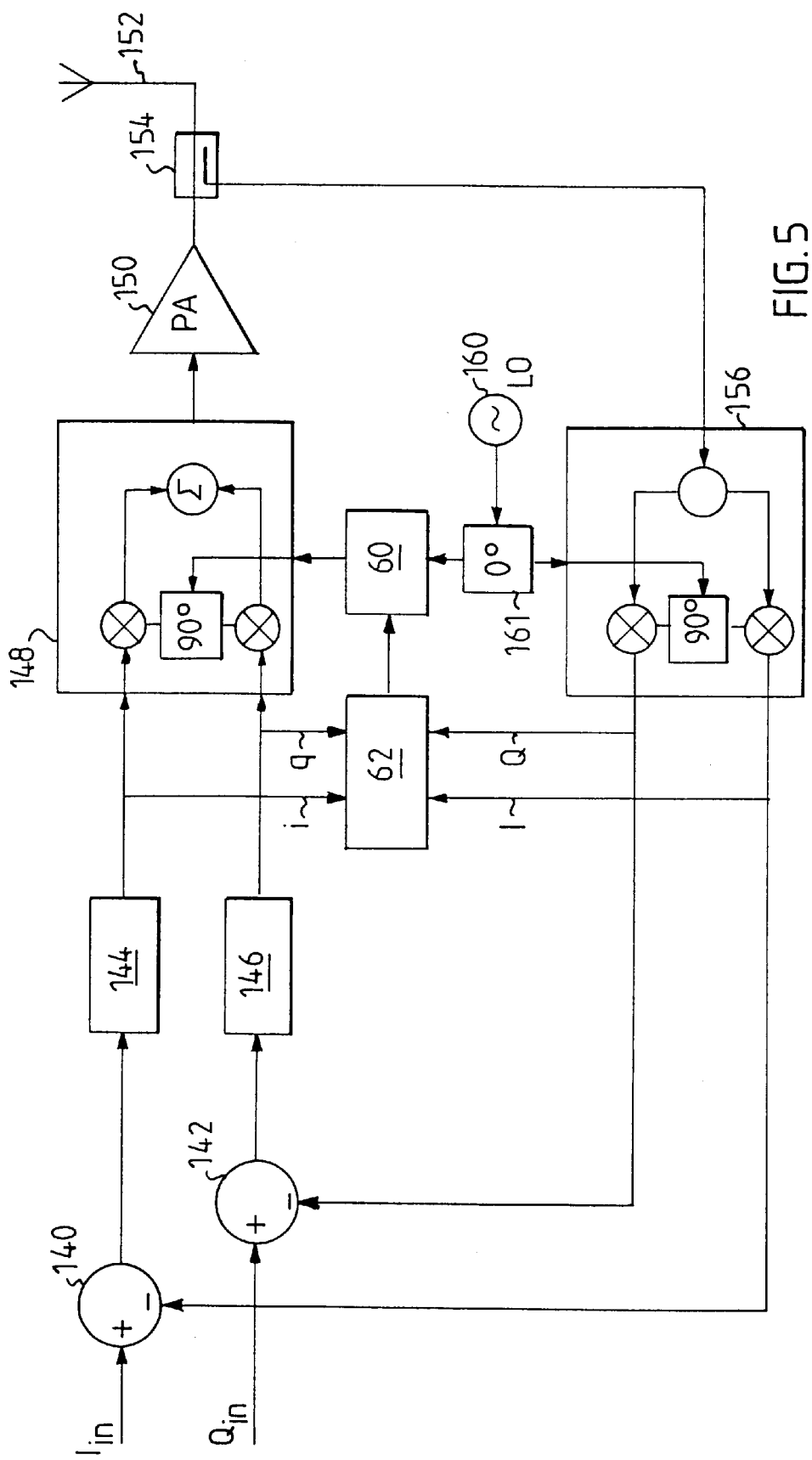
FIG. 5 shows a Cartesian feedback transmitter according to an embodiment of the invention.

FIG. 5 shows an embodiment of a controller 62 according to the invention, applied to a Cartesian feedback transmitter, according to yet another embodiment of the invention. The controller 62 may be a controller 52 for performing the steps described with reference to FIG. 2A. Cartesian input signals $I_{in}$, $Q_{in}$ and Cartesian feedback signals I, Q are combined in a first and second sub-tractor 140, 142. The combined signals are fed to respective gain and filter means 144, 146 the output signals i, q of which are fed to a quadrature modulator 148. The modu-lator output signal is amplified in a power amplifier 150 and forwarded to an antenna 152. Error signals being the output signals i, q of the gain and filter means 144, 146 are fed to a phase adjuster 62. The amplified modulator output signal is tapped using a coupler 154 and fed to a quadrature demodulator 156 wherein it is demodulated into said Cartesian feedback signals I, Q, which are fed to the subtractors 140, 142 as well as to the phase adjuster 62. Based on the signals input to the phase adjuster, a phase parameter is estimated according to the invention, and said phase estimate is used to control a phase rotator 60, such that the signal from the Local Oscillator 160 arriving at the modulator 148 via a splitter 161 and the phase rotator 60, and at the demodulator 156 via the splitter 161, causes the input signals i, q and the feedback signals I, Q to be phase-aligned or substantially phase-aligned.

With reference to FIG. 5, a main control loop of the transmitter is defined by the signal path including subtractors 140, 142, the gain and filter means 144, 146, quadrature modulator 148, the power amplifier 150, the coupler 154 and via the quadrature de-modulator 156 back to the subtractors 140, 142. In such a control loop it is important that the feedback signals I, Q which are delivered to the subtractors 140, 142 are phase aligned with the Cartesian input signals $I_{in}$, $Q_{in}$.

Let us consider an extreme example for the purpose of simplifying the understanding of the logic behind the invention: If, for example, the feedback signals I, Q were phase shifted by 180 degrees in relation to the input signals $I_{in}$, $Q_{in}$: then the polarity of the feedback signals would be such that the subtractors 140,142 actually cause an addition rather than a subtraction. It is clear to any person skilled in the art that a system like that would be totally unstable. It is, in fact preferable to keep the feedback signals I, Q phase aligned with the Cartesian input signals $I_{in}$, $Q_{in}$, i.e. the phase deviation is preferably kept to zero, to ensure that the subtractors 140, 142, respectively cause a subtraction.

According to the embodiment of the invention shown in FIG. 5 there is provided a supervisory phase alignment control loop, which is defined by the signal path including quadrature modulator 148, power amplifier 150, coupler 154, quadrature demodulator 156, phase adjuster 62, and via phase rotator 60 back to the quadrature modulator 148.

A first signal pair i, q are tapped from the forward path of the main control loop, and a second signal pair I, Q are tapped from the feedback path of the main control loop. The phase adjuster 62, which is positioned in the supervisory phase alignment control loop, continuously or repeatedly receives the first signal pair i, q as well as the second signal pair I, Q. In response to the first and second signal pairs the phase adjuster 62 in combination with the phase rotator 60 operates to reduce or eliminate any phase deviation in the main control loop. The continuous reduction or elimination of any phase deviation in the main control loop ensures a stable negative feedback in the main control loop.

What is claimed is:

1. A method of compensating a phase rotation in a control loop of a Cartesian control system, the method comprising the steps of:
   receiving a first Cartesian signal pair, having signal values that originate from a first location in the control loop;
   receiving a second Cartesian signal pair, having signal values that originate from a second location in the control loop;
   differentiating the signal values of the first and second Cartesian signal pairs to generate a set of differentiated signal values;
   generating an estimate of a phase difference between the first Cartesian signal pair and the second Cartesian signal pair depending upon the differentiated signal values, the phase difference being indicative of a phase rotation in the control loop;
   generating a reference value that depends upon the phase difference estimate; and
   performing a rotation of phase in the control loop in accordance with the reference value so as to compensate for the phase rotation.

2. The method according to claim 1, wherein the step of generating a reference value further comprises the steps of:
   retrieving a previous reference value; and
   generating an updated reference value by increasing the numerical value of the previous reference value if the phase estimate has a first sign, or by decreasing the numerical value of the previous reference value if the phase estimate has a second sign.

3. The method according to claim 1, wherein the method steps of claim 1 are repeated at least once.

4. A computer program product for use with a Cartesian control system having a control loop and a digital processing device, the computer program product comprising:
   a recording medium;
   computer readable code means, recorded on the recording medium, for directing the digital processing device to receive a first signal pair originating from a first location in the control loop;
   computer readable code means, recorded on the recording medium, for directing the digital processing device to receive a second signal pair originating from a second location in the control loop;
   computer readable code means, recorded on the recording medium, for directing the digital processing device to differentiate the first and second signal pairs to generate a set of differentiated signal values and to generate an estimate of a phase difference between the first signal pair and the second signal pair that depends upon the differentiated signal values, the phase difference being indicative of a phase rotation in the control loop;
   computer readable code means, recorded on the recording medium, for directing the digital processing device to generate a reference that depends upon the phase difference estimate; and
   computer readable code means, recorded on the recording medium, for directing the digital processing device to cause a rotation of phase in the control loop in accordance with the reference value so as to compensate for the phase rotation.

5. A control means in a Cartesian control system having a control loop with Cartesian input signals and Cartesian feedback signals, the control means comprising:
   a phase rotator for implementing a phase rotation of Cartesian signals; and
   a phase adjuster having means for generating at least one phase parameter using signals tapped from different points in the control loop and for controlling the phase rotator with the phase parameter such that the Cartesian input signals and the Cartesian feedback signals are maintained substantially phase aligned;
   wherein the phase parameter generating means is arranged to differentiate the signals tapped from the different points in the control loop so as to obtain a set of differential values and to generate the phase parameter in response to the set of differential values.

6. The control means according to claim 5, wherein the phase parameter is generated in accordance with the following equation:

$$\theta = \tan^{-1} \frac{\Delta q \times \Delta I - \Delta i \times \Delta Q}{\Delta q \times \Delta Q + \Delta i \times \Delta I},$$

wherein θ is the phase parameter value, i and q are Cartesian signals tapped from a first location in the control loop, and I and Q are Cartesian signals tapped from a second location in the control loop.

7. The control means according to claim 5, wherein the phase parameter is generated in accordance with the following equation:

$$\theta = \tan^{-1} \frac{\Delta q \times \Delta I - \Delta i \times \Delta Q}{\Delta q \times \Delta Q + \Delta i \times \Delta I},$$

where θ is the phase parameter value, i and q are Cartesian signals tapped from a first location in the control loop, and I and Q are Cartesian signals tapped from a second location in the control loop.

8. The control means according to claim 5, wherein the phase parameter is generated in accordance with the following equation:

$$\theta = \sin^{-1} \frac{\Delta q \times \Delta I - \Delta i \times \Delta Q}{\sqrt{(\Delta q^2 + \Delta i^2)(\Delta Q^2 + \Delta I^2)}},$$

where θ is the phase parameter value, i and q are Cartesian signals tapped from a first location in the control loop, and I and Q are Cartesian signals tapped from a second location in the control loop.

9. The control means according to claim 5, wherein the phase parameter is generated in accordance with the following equation:

$$\theta = \frac{\Delta q \times \Delta I - \Delta i \times \Delta Q}{\sqrt{(\Delta q^2 + \Delta i^2)(\Delta Q^2 + \Delta I^2)}},$$

where θ is the phase parameter value, i and q are Cartesian signals tapped from a first location in the control loop, and I and Q are Cartesian signals tapped from a second location in the control loop.

10. The control means according to claim 5, wherein the phase parameter is generated in accordance with the following equation:

θ=Δq×ΔI−Δi×ΔQ, where θ is the phase parameter value, i and q are Cartesian signals tapped from a first location in the control loop, and I and Q are Cartesian signals tapped from a second location in the control loop.

11. The control means according to claim 5, comprised in at least one Cartesian control system within a feedforward linearizer.

12. A Cartesian control system having Cartesian input signals and Cartesian feedback signals, comprising:
- a first and a second subtractor for subtracting the Cartesian feedback signals from the Cartesian input signals, thereby forming Cartesian error signals;
- a phase rotator for implementing a phase rotation of the Cartesian error signals or feedback signals;
- a gain and filter means for amplifying the phase rotated Cartesian signals;
- a first and a second set of tapping means for tapping signals from different points in the Cartesian control loop;
- a phase adjuster having means for generating at least one phase parameter using the tapped signals, and for controlling the phase rotator using the phase parameter;
- wherein the phase parameter generating means is arranged to differentiate the signals tapped from the control loop so as to obtain a set of differential values, and to generate the phase parameter in response to the set of differential values; and
- a system to be controlled;
- wherein phase-alignment is maintained between the Cartesian input signals and the Cartesian feedback signals.

13. The Cartesian control system according to claim 12, wherein the means for generating phase parameters are arranged to operate in a manner that is non-obtrusive for the control system operation.

14. A method for Cartesian feedback control, comprising:
- combining Cartesian feedback signals and Cartesian input signals to form Cartesian error signals;
- phase rotating the Cartesian error signals or the Cartesian feedback signals;
- amplifying the phase rotated Cartesian error signals or feedback signals;
- tapping two sets of signals from different points in a Cartesian control loop;
- differentiating the signals of the two sets of signals to generate differentiated signal values;
- generating at least one phase parameter using the differentiated signal values;
- adjusting the phase rotation of the Cartesian error signals or the Cartesian feedback signals using the phase parameter;
- filtering the amplified, phase rotated Cartesian signals to generate Cartesian control signals.

15. The method for Cartesian loop feedback control according to claim 14, wherein the phase parameter is derived in a manner that is non-obtrusive for the control system operation.

16. A phase adjuster in a Cartesian control system, for adjusting a phase difference between Cartesian feedback signals and Cartesian error signals, wherein the Cartesian error signals represent the difference between, the Cartesian feedback signals and Cartesian input signals, the phase adjuster comprising:
- phase parameter generating means adapted to differentiate two pairs of signals tapped from two different locations on the control loop to obtain a set of differential values, to generate a phase parameter in response to the set of differential values; and
- phase adjusting means controlled by the phase parameter generating means for generating a phase adjustment value that depends upon the phase parameter for adjusting the phase of one of the Cartesian feedback and error signals.

17. The phase adjuster according to claim 16, further arranged to be non-obtrusive to normal system operation.

18. The phase adjuster according to claim 16, wherein the phase parameter is generated in accordance with the following equation:

$$\theta = \tan^{-1} \frac{\Delta q \times \Delta I - \Delta i \times \Delta Q}{\Delta q \times \Delta Q + \Delta i \times \Delta I},$$

where θ is the phase parameter value, i and q are signals tapped from a first location, and I and Q are signals tapped from a second location.

19. The phase adjuster according to claim 16, wherein the phase parameter is generated in accordance with the following equation:

$$\theta = \frac{\Delta q \times \Delta I - \Delta i \times \Delta Q}{\Delta q \times \Delta Q + \Delta i \times \Delta I},$$

where θ is the phase parameter value, i and q are signals tapped from a first location, and I and Q are signals tapped from a second location.

20. The phase adjuster according to claim 16, wherein the phase parameter is generated in accordance with the following equation:

$$\theta = \sin^{-1}\frac{\Delta q \times \Delta I - \Delta i \times \Delta Q}{\sqrt{(\Delta q^2 + \Delta i^2)(\Delta Q^2 + \Delta I^2)}},$$

where θ is the phase parameter value, i and q are signals tapped from a first location, and I and Q are signals tapped from a second location.

21. The phase adjuster according to claim 16, wherein the phase parameter is generated in accordance with the following equation:

$$\theta = \frac{\Delta q \times \Delta I - \Delta i \times \Delta Q}{\sqrt{(\Delta q^2 + \Delta i^2)(\Delta Q^2 + \Delta I^2)}},$$

where θ is the phase parameter value, i and q are signals tapped from a first location, and I and Q are signals tapped from a second location.

22. The phase adjuster according to claim 16, wherein the phase parameter is generated in accordance with the following equation:

$$\theta = \Delta q \times \Delta I - \Delta i \times \Delta Q,$$

where θ is the phase parameter value, i and q are signals tapped from a first location, and I and Q are signals tapped from a second location.

23. The phase adjuster according to claim 16, wherein the phase adjusted is comprised in at least one Cartesian control system within a feedforward linearizer.

24. A method for phase adjustment in a Cartesian control system having a control loop with Cartesian input signals and Cartesian feedback signals, the method comprising:
   tapping Cartesian signals from the control loop;
   differentiating the tapped signals so as to generate differentiated signal values;
   generating at least one phase parameter using the differentiated signal values;
   adjusting a phase of at least one of the Cartesian signals using the at least one phase parameter wherein phase deviations between the Cartesian signals and Cartesian feedback signals are minimized.

25. The method according to claim 24, wherein the steps are non-obtrusive to the control system operation.

26. The method according to claim 24, wherein the phase parameter is generated in accordance with the following equation:

$$\theta = \tan^{-1}\frac{\Delta q \times \Delta I - \Delta i \times \Delta Q}{\Delta q \times \Delta Q + \Delta i \times \Delta I},$$

where θ is the phase parameter value, i and q are signals tapped from a first location, and I and Q are signals tapped from a second location.

27. The method according to claim 24, wherein the phase parameter is generated in accordance with the following equation:

$$\theta = \frac{\Delta q \times \Delta I - \Delta i \times \Delta Q}{\Delta q \times \Delta Q + \Delta i \times \Delta I},$$

where θ is the phase parameter value, i and q are signals tapped from a first location, and I and Q are signals tapped from a second location.

28. The method according to claim 24, wherein the phase parameter is generated in accordance with the following equation:

$$\theta = \sin^{-1}\frac{\Delta q \times \Delta I - \Delta i \times \Delta Q}{\sqrt{(\Delta q^2 + \Delta i^2)(\Delta Q^2 + \Delta I^2)}},$$

where θ is the phase parameter value, i and q are signals tapped from a first location, and I and Q are signals tapped from a second location.

29. A method according to claim 24, wherein the phase parameter is generated in accordance with the following equation:

$$\theta = \frac{\Delta q \times \Delta I - \Delta i \times \Delta Q}{\sqrt{(\Delta q^2 + \Delta i^2)(\Delta Q^2 + \Delta I^2)}},$$

where θ is the phase parameter value, i and q are signals tapped from a first location, and I and Q are signals tapped from a second location.

30. The method according to claim 24, wherein the phase parameter is generated in accordance with the following equation:

$$\theta = \Delta q \times \Delta I - \Delta i \times \Delta Q,$$

where θ is the phase parameter value, i and q are signals tapped from a first location, and I and Q are signals tapped from a second location.

31. Use of the control method of claim 24, for controlling at least one of the Cartesian control system within a feedforward linearizer.

* * * * *